(12) United States Patent
Lapat et al.

(10) Patent No.: US 9,250,313 B2
(45) Date of Patent: Feb. 2, 2016

(54) ELECTRONICALLY RECONFIGURABLE BANDWIDTH AND CHANNEL NUMBER ANALOG-TO-DIGITAL CONVERTER CIRCUIT FOR RADAR SYSTEMS

(71) Applicant: RAYTHEON COMPANY, Waltham, MA (US)

(72) Inventors: Ronald Lapat, Sudbury, MA (US); Michael R. Patrizi, McKinney, TX (US); Shane D. Blair, Woburn, MA (US)

(73) Assignee: RAYTHEON COMPANY, Waltham, MA (US)

( * ) Notice: Subject to any disclaimer, the term of this patent is extended or adjusted under 35 U.S.C. 154(b) by 230 days.

(21) Appl. No.: 14/097,235

(22) Filed: Dec. 4, 2013

(65) Prior Publication Data

US 2015/0153441 A1   Jun. 4, 2015

(51) Int. Cl.
G01S 7/02 (2006.01)
H03M 1/12 (2006.01)
H03M 1/00 (2006.01)
G01S 7/00 (2006.01)

(52) U.S. Cl.
CPC ............... *G01S 7/02* (2013.01); *H03M 1/004* (2013.01); *H03M 1/123* (2013.01); *H03M 1/1215* (2013.01)

(58) Field of Classification Search
CPC ............ G01S 7/02; G01S 5/02; G01S 5/04; G01S 7/021; G01S 7/28; G01S 7/2813; G01S 13/02; G01S 13/06; G01S 13/42; G01S 13/44; G01S 13/4409; G01S 13/74; G01S 13/76; G01S 13/78; G01S 13/781; G01S 13/784; H03M 1/004; H03M 1/12; H03M 1/1205; H03M 1/121; H03M 1/1215; H03M 1/123; H03M 1/00; H03M 1/005; H03M 1/06; H03M 1/0617; H03M 1/0624; H03M 1/0675; H03M 1/069; H03M 1/0634; H03M 1/0643; H03M 1/0651; H03M 1/14; H03M 1/16; H03M 1/164; H03M 1/167; H03M 1/66; H03M 1/68; H03M 1/20; H03M 1/202; H03M 1/206; G06J 1/00; H04B 1/0003; H04B 1/0007; H04B 1/001
USPC ............... 342/82, 89, 175, 195, 118, 147, 342/149–154; 341/126, 155–172; 708/1; 375/316, 344

See application file for complete search history.

(56) References Cited

U.S. PATENT DOCUMENTS 3,710,377 A * 1/1973 Guillen ............... H03M 1/67
                                                         341/156
3,820,112 A * 6/1974 Roth ................... H03M 1/00
                                                         341/899

(Continued)

FOREIGN PATENT DOCUMENTS

EP          1738458 B1       9/2009

*Primary Examiner* — Bernarr Gregory
(74) *Attorney, Agent, or Firm* — Christie, Parker & Hale, LLP (57) ABSTRACT

An analog-to-digital converter circuit for a radar apparatus, the analog-to-digital converter circuit including analog-to-digital converters that are electronically reconfigurable to operate in a multi-channel mode with a first bandwidth by clocking the ADCs in phase with one another, or a single-channel mode with a second bandwidth higher than the first bandwidth by clocking the ADCs out of phase with one another and optimizing the intermediate frequency for the respective mode.

19 Claims, 6 Drawing Sheets

(56) References Cited

U.S. PATENT DOCUMENTS

| | | | | |
|---|---|---|---|---|
| 3,887,923 A * | 6/1975 | Hendrix | G01S 5/04 | 342/179 |
| 4,577,193 A * | 3/1986 | Kiuchi | G01S 7/2813 | 342/380 |
| 4,968,988 A * | 11/1990 | Miki | H03M 1/0651 | 341/118 |
| 5,014,059 A * | 5/1991 | Seckora | H03M 1/1215 | 341/150 |
| 5,019,820 A * | 5/1991 | Matsuzawa | H03M 1/069 | 341/156 |
| 5,457,644 A * | 10/1995 | McCollum | G06J 1/00 | 708/1 |
| 5,568,142 A * | 10/1996 | Velazquez | H03M 1/121 | 341/126 |
| 5,945,935 A * | 8/1999 | Kusumoto | H03M 1/206 | 341/159 |
| 6,473,013 B1 * | 10/2002 | Velazquez | H03M 1/1215 | 341/155 |
| 6,473,021 B1 * | 10/2002 | Somayajula | H03M 1/68 | 341/155 |
| 6,727,842 B1 * | 4/2004 | Schleder | G01S 13/784 | 342/195 |
| 6,864,822 B2 | 3/2005 | Gulati et al. | | |
| 7,002,501 B2 * | 2/2006 | Gulati | H03M 1/005 | 341/155 |
| 7,227,479 B1 * | 6/2007 | Chen | H03M 1/1004 | 341/155 |
| 7,292,170 B2 * | 11/2007 | Kinyua | H03M 1/0624 | 341/155 |
| 7,327,303 B1 * | 2/2008 | Halsey | G01S 7/021 | 342/175 |
| 7,479,913 B1 * | 1/2009 | Thiagarajan | H03M 1/005 | 341/155 |
| 7,839,323 B2 * | 11/2010 | Kidambi | H03M 1/0624 | 342/118 |
| 8,248,289 B2 | 8/2012 | Bright et al. | | |
| 8,576,117 B2 * | 11/2013 | Lynam | G01S 13/4409 | 342/149 |
| 8,711,026 B1 * | 4/2014 | Kappes | H03M 1/12 | 341/155 |
| 8,837,646 B2 * | 9/2014 | De Ruijter | H04B 1/001 | 375/344 |
| 2011/0140953 A1 | 6/2011 | Lynam | | |
| 2013/0077715 A1 | 3/2013 | De Ruijter | | |

* cited by examiner

FIG. 6

ELECTRONICALLY RECONFIGURABLE BANDWIDTH AND CHANNEL NUMBER ANALOG-TO-DIGITAL CONVERTER CIRCUIT FOR RADAR SYSTEMS

BACKGROUND

1. Field

Aspects of the present invention relate generally to a multi-mode radar system, and more particularly to an analog-to-digital converter circuit for a radar system that is reconfigurable to operate in a multi-channel, narrow/medium bandwidth mode or a single-channel, wide bandwidth mode, and method of operating the same.

2. Description of Related Art

Radars generally operate in a narrow to-medium instantaneous bandwidth mode for search and track operations by using waveforms that may be sampled with lower-cost, higher fidelity and higher-bit-resolution, narrow/medium band analog-to-digital converters (ADCs). However, high instantaneous bandwidth capability is often used in radars for wideband tracking, threat discrimination, and clutter mitigation, for example. Accordingly, a radar apparatus capable of operating in both narrow/medium band and wide band with similar performance specifications, at both bandwidths, in terms of number of bits of resolution and signal fidelity, is desired.

Ultra-wideband ADCs may meet overall sampling requirements (i.e., capable of narrow to medium or wide band sampling), but generally compromise on dynamic range, spurious-free dynamic range (SFDR), and signal-to-noise ratio (SNR), and have high power consumption, processing, and cost requirements compared to lower bandwidth ADCs.

Alternatively, physically separate narrow/medium band and wideband channels configured in parallel may provide the desired sampling requirements and measurement fidelity for each mode, but providing these separate channels comes at higher cost, lower wideband signal fidelity, and greater real estate, and does not aid in reducing size, weight, and power (SWaP) of the system, which is also desirable.

Stretch Processing and Frequency Jump Burst methods may also provide some wideband capability while using lower-cost narrow/medium band ADCs, but these methods have well-known shortcomings. For example, Stretch Processing must trade-off range extent to achieve the high bandwidth imaging, and Frequency Jump Burst gives up waveform flexibility.

The challenges of the existing wideband or multi-mode radar technology motivate developing an architecture that reconfigurably supports both wideband and narrowband radar functions, in order to mitigate cost and component redundancies, and ideally mitigate fidelity degradation typical of stand-alone ultrawideband ADCs.

SUMMARY

Aspects of the present invention are directed toward providing an analog-to-digital converter circuit for a radar system that is electronically reconfigurable to operate in multi-channel, narrow/medium band mode, or single-channel, time-interleaved, instantaneous wideband mode that mitigates costs, performance degradation, and component redundancies.

Aspects of the present invention relate to analog-to-digital converters (ADCs) for radar devices that switchably operate in either a normal (e.g., multi-channel, narrow/medium band) mode or a time-interleaved (e.g., single-channel, instantaneous, wideband) mode. In the time-interleaved mode, each ADC may continue operating at its nominal sampling rate, but by clocking each ADC out of phase with respect to every other ADC and then multiplexing each of their outputs together, the ADCs may be effectively combined into a single wideband ADC. This eliminates circuit redundancies, and capitalizes on the lower cost and higher signal fidelity performance of the individual lower sampling rate ADCs.

According to an embodiment of the present invention, there is provided an analog-to-digital converter circuit for a radar apparatus, the analog-to-digital converter circuit including: a plurality of analog-to-digital converters. Here, the analog-to-digital converters are dynamically configurable to operate in a multi-channel mode with a first instantaneous bandwidth and a single-channel mode with a second instantaneous bandwidth higher than the first instantaneous bandwidth.

The analog-to-digital converters may be configured to be operated in phase with one another when in the multi-channel mode, and the analog-to-digital converters may be configured to be operated out of phase with one another when in the single-channel mode.

When in the multi-channel mode, each of the analog-to-digital converters may be configured to receive a corresponding one of a plurality of analog input signals and may be configured to sample the corresponding one of the analog input signals at a first sample rate to generate a corresponding one of a plurality of digital output signals. When in the single-channel mode, at least two of the analog-to-digital converters may be configured to receive a same one of the analog input signals and may be configured to collectively sample the same one of the analog input signals at a second sample rate to generate at least two of the digital output signals, the at least two of the digital output signals being configured to collectively digitally represent the same one of the analog input signals. The second sample rate is higher than the first sample rate.

According to one embodiment, the analog-to-digital converter circuit is included in a receiver of a radar apparatus, which may further include a frequency converter configured to receive the radar signals from the radar antenna and electronically reconfigurable to dynamically center at least one of the radar signals according to whether the receiver is in the multi-channel mode or the single channel mode to generate at least one analog input signal provided to the analog-to-digital converter circuit.

The frequency converter may include a first mixer configured to receive a first radar signal of the radar signals, to receive a center signal, and to mix the first radar signal with the center signal to generate a centered first radar signal. The center signal may be dynamically adjustable according to whether the receiver is in the multi-channel mode or the single channel mode. Here, the at least one analog input signal provided to the analog digital converter circuit corresponds to the centered first radar signal.

According to another embodiment of the present invention, there is provided a method of operating a multi-mode analog-to-digital converter circuit including a plurality of digital to analog converters, the method including: receiving a plurality of analog signals; determining whether the multi-mode analog-to-digital converter circuit is in a single channel mode or a multi-channel mode. Here, when the multi-mode analog-to-digital converter circuit is in the multi-channel mode: provide the analog signals to the analog-to-digital circuits to generate a plurality of digital signals corresponding to the analog signals, the digital signals having been sampled at a first sampling rate; and drive the analog-to-digital converters in phase with one another. Also, when the multimode analog-to-digital converter circuit is in the single channel mode: provide the same one of the analog signals to the analog-to-digital converters to generate the digital signals corresponding to the same one of the analog signals; consolidate the digital signals to generate a consolidated digital signal corresponding to the same one of the analog signals, the consolidated digital signal having an effective sampling rate that is higher than the first sampling rate; and driving the analog-to-digital converters out of phase with one another.

When in single channel mode, a phase spacing for driving the analog-to-digital converters may be set according to 360°/N, N being a number of the analog-to-digital converters. When in the single-channel mode, the effective sampling rate of the analog-to-digital converters may correspond to N×F, F being a nominal sampling rate of one of the analog-to-digital converters.

BRIEF DESCRIPTION OF THE DRAWINGS

The accompanying drawings illustrate example embodiments of the present invention, and, together with this specification, serve to explain features and aspects of the present invention.

DETAILED DESCRIPTION

Aspects of the present invention relate to analog-to-digital converters (ADCs) for radar devices that switchably operate in either a normal (e.g., multi-channel, narrow/medium band) mode or a time-interleaved (e.g., single-channel, instantaneous, wideband) mode. In the time-interleaved mode, each ADC continues operating at its nominal sampling rate, but by clocking each ADC out of phase with respect to every other ADC and then multiplexing each of their outputs together, the ADCs are effectively combined into a single wideband ADC. This eliminates circuit redundancies, and capitalizes on the lower cost and higher signal fidelity performance of the individual lower sampling rate ADCs.

Analog-to-digital converters for radar devices that are electronically reconfigurable to operate in multi-channel, narrow/medium band mode, or single-channel, wideband mode according to example embodiments of the present invention will now be described in more detail with reference to the accompanying drawings so that a person having ordinary skill in the art may readily make and use embodiments of the present invention.

In the following detailed description, only certain embodiments of the present invention are shown and described, by way of illustration. As those skilled in the art would recognize, the invention may be embodied in many different forms and should not be construed as being limited to the embodiments set forth herein. Instead, the detailed description should be construed to encompass the scope of the appended claims and equivalents thereof. Also, in the present application, when an element is referred to as being "coupled" (e.g., electrically coupled or connected) to another element, it can be directly coupled to the other element or indirectly coupled to the other element with one or more intervening elements interposed therebetween. Hereinafter, like reference numerals refer to like elements.

Figure 1:
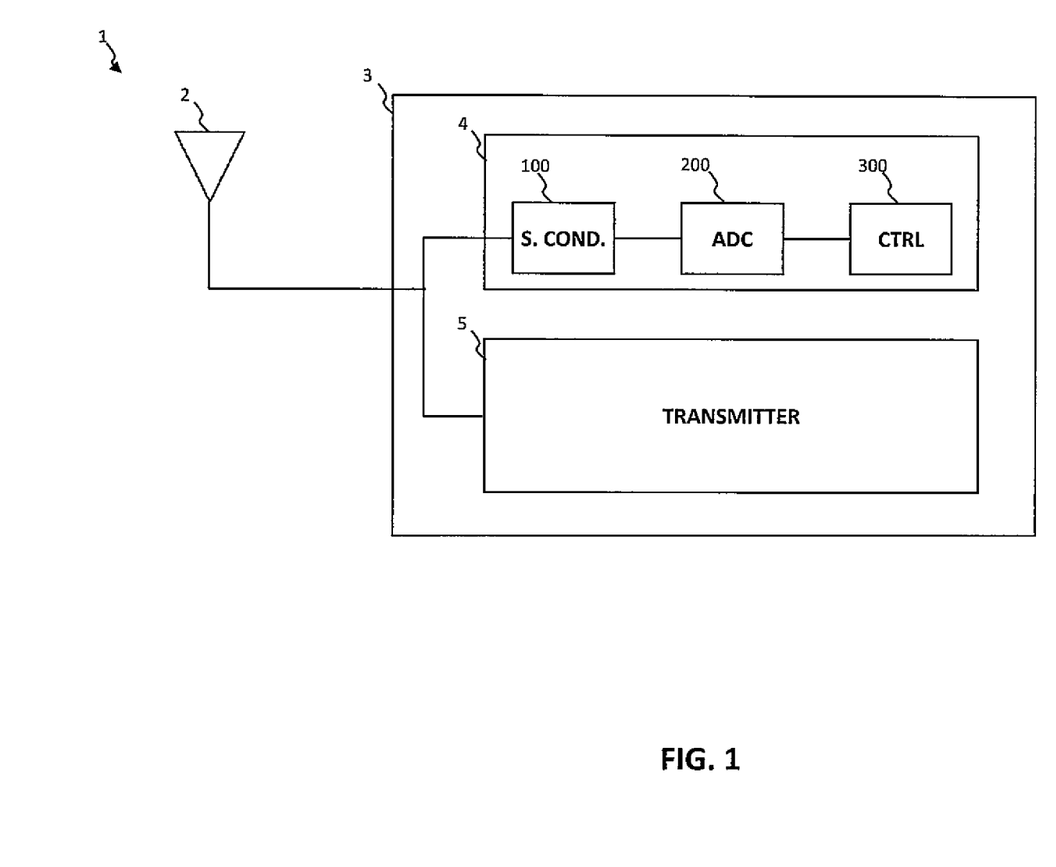
FIG. 1 is a schematic diagram of a radar apparatus according to an embodiment of the present invention.

FIG. 1 is a schematic diagram of a radar apparatus according to an embodiment of the present invention.

According to one embodiment, a radar apparatus 1 includes an antenna 2 coupled to a transceiver 3, which includes a receiver 4 and a transmitter 5. The receiver 4 may include a frequency converter 100, a multi-mode analog-to-digital converter circuit 200, and a controller 300.

The radar apparatus 1 is electronically reconfigurable to operate in multi-channel, narrow/medium band mode, or single-channel, wideband mode. For example, the radar apparatus 1, according to one embodiment, includes the multi-mode analog-to-digital converter circuit 200 that enables the electronic reconfiguration between a multi-channel, narrow/medium band mode and a single-channel, wide band mode.

By including the multi-mode analog-to-digital converter circuit 200 in the radar apparatus 1 in the present embodiment, the radar apparatus 1 may, for example, operate in a narrow/medium band mode for search and track operations and operate in wideband mode to achieve a high band resolution for wideband tracking, threat discrimination, and clutter mitigation. Further, the radar apparatus 1 may operate in the narrow/medium band mode and the wideband mode by using lower cost, higher fidelity, narrow/medium band analog-to-digital converters (ADCs), which mitigates costs, performance degradation, and component redundancies.

Figure 2:
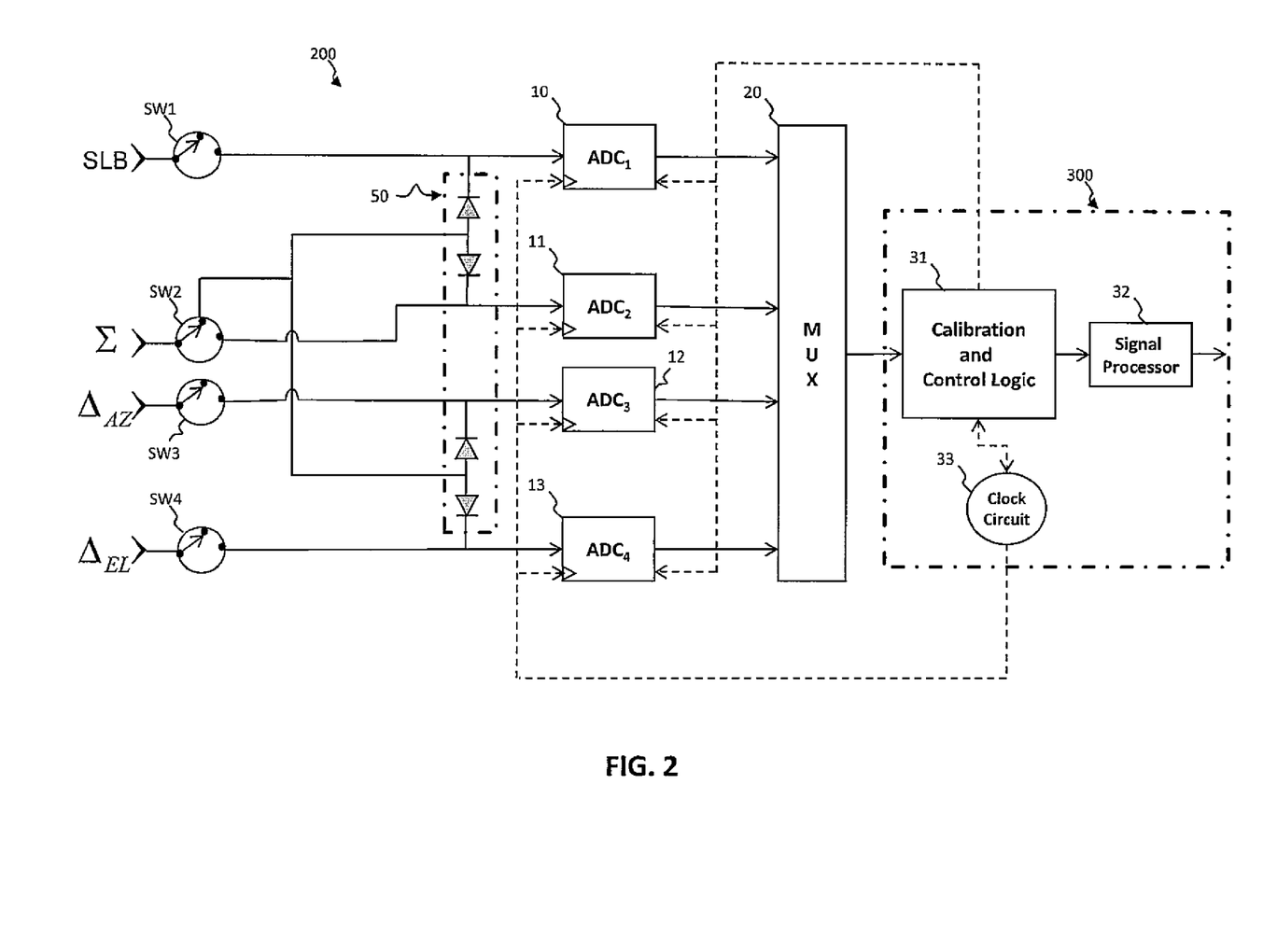
FIG. 2 is a schematic diagram of an electronically reconfigurable multi-mode analog-to-digital converter circuit and controller for the radar apparatus of FIG. 1.

Hereinafter, an embodiment of a multi-mode analog-to-digital converter circuit is described in detail with reference to FIG. 2. FIG. 2 is a schematic diagram of an electronically reconfigurable multi-mode analog-to-digital converter circuit and controller for a radar receiver according to an embodiment of the present invention.

According to one embodiment, a reconfigurable multi-mode analog-to-digital converter circuit 200 includes a set of analog-to-digital converters (ADCs) 10 through 13, a multiplexer (MUX) 20, a splitter 40, and switches SW1 through SW4.

As shown in FIGS. 1 and 2, the analog-to-digital converter circuit 200 is coupled to a controller 300. The controller 300 may include calibration and control logic 31, a signal processor 32, and a clock circuit 33.

The analog-to-digital converter (ADC) circuit 200 is electronically (i.e., dynamically) configurable to operate in a multi-channel, narrow/medium band mode or a single-channel, wideband mode by switching the ADCs 10 through 13 between normal and time-interleaved operation. According to one embodiment, the ADCs are all narrow/medium band ADCs configured to sample an input signal at a nominal frequency (i.e., normal operation), for example, 200 megahertz. However, by clocking each of the ADCs 10 through 13 out of phase with respect to each other and then multiplexing each of their outputs together (i.e., time-interleaved operation), the narrow/medium band ADCs 10 through 13 are effectively combined into a single wideband ADC sampling at a frequency higher than the nominal frequency, for example, 800 megahertz.

According to one embodiment, the effective sampling rate (and thus the bandwidth improvement) is proportional to the number of time-interleaved ADCs. For example, with N ADCs (N being a positive real number) in time-interleaved operation and with each ADC having a nominal sampling rate of F (F being a frequency), the effective sampling rate of the multiplexed ADCs corresponds to N×F. In this example, the phase operation of the ADCs is evenly spaced according to 360°/N.

The ADC circuit 200 receives signals from the antenna 2. These signals may be conditioned by the frequency converter 100 before being received by the ADC circuit 200.

According to one embodiment, the ADC circuit 200 is configured for use in a monopulse radar system with a side-lobe blanking circuit, and receives a sum signal Σ, an azimuth difference signal $\Delta_{AZ}$, an elevation difference signal $\Delta_{EL}$, and a sidelobe blanker signal SLB. Hereinafter, a four channel ADC circuit for a monopulse radar system with a sidelobe blanking circuit is used an example embodiment to describe features of embodiment's of the present invention; however, as a person of ordinary skill in the art would readily understand, embodiments of the present invention are not so limited. For example, a person of ordinary skill in the art would understand that ADC circuits of the present invention are scalable to include N channels, may receive other signals, or used in other types of radar systems.

In the radar apparatus 1, the antenna 2 may include a phased array antenna having four quadrants. The four quadrants may respectively provide four signals A through D, which may be used to generate the sum signal Σ, the azimuth difference signal $\Delta_{AZ}$, and the elevation difference signal $\Delta_{EL}$. For example, the sum signal Σ may be generated by adding the signals A, B, C, and D, the azimuth difference signal $\Delta_{AZ}$ may be generated by subtracting the sum of signals C and D from the sum of signals A and B, and the elevation difference signal $\Delta_{EL}$ may be generated by subtracting the sum of signals B and C from the sum of signals A and D.

The antenna 2 may also include a guard antenna for supplying a guard signal. According to one embodiment, the guard signal together with the azimuth difference signal $\Delta_{AZ}$ and the elevation difference signal $\Delta_{EL}$ are processed to generate the sidelobe blanker signal SLB. The sidelobe blanker signal SLB may be used to discriminate between mainlobe and sidelobe echoes.

In the ADC circuit illustrated in FIG. 2, the sidelobe blanker signal SLB is received at an input terminal of a first switch SW1, the sum signal Σ is received at a input terminal of a second switch SW2, the azimuth difference signal $\Delta_{AZ}$ is received at an input terminal of a third switch SW3, and the elevation difference signal $\Delta_{EL}$ is received at an input terminal of a fourth switch SW4.

According to one embodiment, each of the first through fourth switches SW1 through SW4 is capable of being in one of two states. In a first state, each of the first through fourth switches SW1 through SW4 couples its input terminal to a first output terminal, the first output terminal being coupled in turn to a respective one of the ADCs 10 through 13. In the second state, each of the first through fourth switches SW1 through SW4 couples its input terminal to a second output terminal. Here, the second output terminals of the first switch SW1, the third switch SW3, and the fourth switch SW4 are terminated, and the second output terminal of the second switch SW2 is coupled to a splitter 50.

The states of the first though fourth switches SW1 through SW4 may be controlled by switch control signals (not shown) received from the controller 300. That is, they may be electronically reconfigurable.

According to one embodiment, the first through fourth switches SW1 through SW4 are in the first state when the ADC circuit 200 is in normal operation. Here, the first through fourth switches SW1 through SW4 pass a respective one of the sidelobe blanking signal SBL, the sum signal Σ, the azimuth difference signal $\Delta_{AZ}$, and the elevation difference signal $\Delta_{EL}$ through to a corresponding one of the ADCs 10 through 13. The ADCs 10 through 13 each sample their received signal and output a digitized version of their received signal to the multiplexer (MUX) 20.

According to one embodiment, when in normal operation, the MUX 20 serializes the digitized sidelobe blanking signal, the digitized sum signal, the digitized azimuth difference signal, and the digitized elevation difference signal, and outputs the serialized signal to the controller 300.

The controller 300 may include calibration and control logic 31, a signal processor 32, and a clock circuit 33.

The serialized signal may be input to the calibration and control logic 31. The calibration and control logic 31 may, for example, analyze the received serialized signal to compensate for gain, timing offset, and jitter to generate a calibrated radar signal. The calibration and control logic 31 may include logic to control the clock circuit 33, the ADCs 10 through 13, and the switches SW1 through SW4. According to one embodiment, the calibration and control logic 31 controls the ADC circuit 200 to selectively operate in the normal mode (e.g., multi-channel, narrow/medium band) or a single-channel wideband mode.

The signal processor 32 may receive a calibrated radar signal from the calibration and control logic. A person of ordinary skill in the art would recognize that the signal processor 32 may perform any of a number of signal processing algorithms to analyze the received radar signal. The signal processor 32 may output the processed radar signal for display or further analysis.

The clock circuit 33 provides clock signals to various devices throughout the radar apparatus 1; for example, the clock circuit 33 provides clock signals to the ADCs 10 through 13. The clock signals output by the clock circuit may be different from one another. For example, the clock signals may be out of phase from one another.

Under normal operation, the clock signals provided to the ADCs 10 through 13 are in phase with one another so as to operate the ADCs 10 through 13 in phase with one another. When the ADCs 10 through 13 are in phase, they are taking samples of their respective signals at the same point in time (i.e., they are in sync). Here, when the ADCs 10 through 13 operate in phase, the ADC circuit 200 is in a multi-channel configuration and is operating at its nominal bandwidth (e.g., a narrow to-medium bandwidth). The ADC circuit 200 may be in this multi-channel nominal bandwidth mode for search and track operations, as examples.

As described above, the ADC circuit 200 may also be configured to operate in a single-channel wideband mode. The ADC circuit 200 may be in this mode for wideband tracking, threat discrimination, and clutter mitigation, as examples. Under single channel wideband operation, the clock signals provided to the ADCs 10 through 13 are out of phase with one another so as to operate the ADCs 10 through 13 out of phase with one another. When the ADCs 10 through 13 are out of phase, they are taking samples at different points of time as to one another. When the ADCs 10 through 13 are operated in this manner, the ADC circuit 200 may be referred to as being in time-interleaved operation.

When the ADC circuit 200 is in time-interleaved operation, the first through fourth switches SW1 through SW4 are controlled to be in the second state. As described above, when the first through fourth switches SW1 through SW4 are in the second state, the sidelobe blanking signal SLB, the azimuth difference signal $\Delta_{AZ}$, and the elevation difference signal $\Delta_{EL}$ are terminated, and the sum signal $\Sigma$ is transmitted to the splitter 50.

The splitter 50 transmits the sum signal $\Sigma$ to all of the ADCs 10 through 13. The symbols within the splitter 50 of FIG. 2 indicate the signal flow from the second switch SW2 to each of the ADCs 10 through 13.

Because the sum signal $\Sigma$ is received at each of the ADCs 10 through 13, each of the ADCs 10 through 13 samples the sum signal $\Sigma$, and because the ADCs 10 through 13 are out of phase, they sample the sum signal $\Sigma$ at a different point in time. Accordingly, while the ADCs 10 through 13 individually operate at their nominal sampling rate, collectively, they may be considered a single ADC with a sampling rate that is higher than the nominal sampling rate of one device. That is, a wide-bandwidth ADC circuit is realized by reusing the existing lower bandwidth ADCs.

According to one embodiment, samples are taken at regular intervals. Because the ADCs 10 through 13 are controlled according to their clock signal, to take samples at regular intervals the clock signals may have an even phase distribution. For example, for the present embodiment having four ADCs, the phases may be spaced apart by 90 degrees, (i.e., 0°, 90°, 180°, and 270°). In this example, if the nominal clock frequency is one megahertz, while individually each ADC takes one sample every microsecond, collectively the ADCs take one sample every 0.25 microseconds (i.e., at $t_0$ s, $t_0$+0.25 µs, $t_0$+0.5 µs, $t_0$+0.75, etc.). This feature is scalable; for example, an ADC circuit 200 with N ADCs may have an 360°/N phase distribution to realize a sampling rate of N times the clock frequency. The above enables implementation of time-interleaved operation, which may be used to realize a wide-bandwidth resolution from lower bandwidth devices.

Referring back to FIG. 2, the sum signal $\Sigma$ may be provided as a wide-band signal to the ADC circuit 200. When in time-interleaved operation, the sum signal $\Sigma$ is distributed to each of the ADCs 10 through 13, which are being operated out of phase from one another. Each of the ADCs 10 through 13 samples the sum signal $\Sigma$, and outputs the sampled signal to the MUX 20. The MUX 20 aggregates (or consolidates) the samples received from the ADCs 10 through 13 into a single digitized version of the sum signal $\Sigma$. As described above, because the ADC circuit 200 is operating in time-interleaved mode, the digitized sum signal is provided with wide-band resolution.

The controller 300 receives the digitized sum signal. And, similar to what is described above in connection with the normal operation, the calibration and control logic 31 and the signal processor 32 may further process and analyze the digitized sum signal to output a processed radar signal.

As described above, the ADC circuit 200 of the present embodiment is of a switchable design to enable time-interleaved and normal operation of an array of ADCs. This in turn enables wideband, single-channel and narrow/medium, band multi-channel operation, with minimal support circuitry. Furthermore, features of the described embodiments facilitate this dual-mode operation with substantial hardware reuse, which reduces cost, package size, and circuit components.

Figure 3:
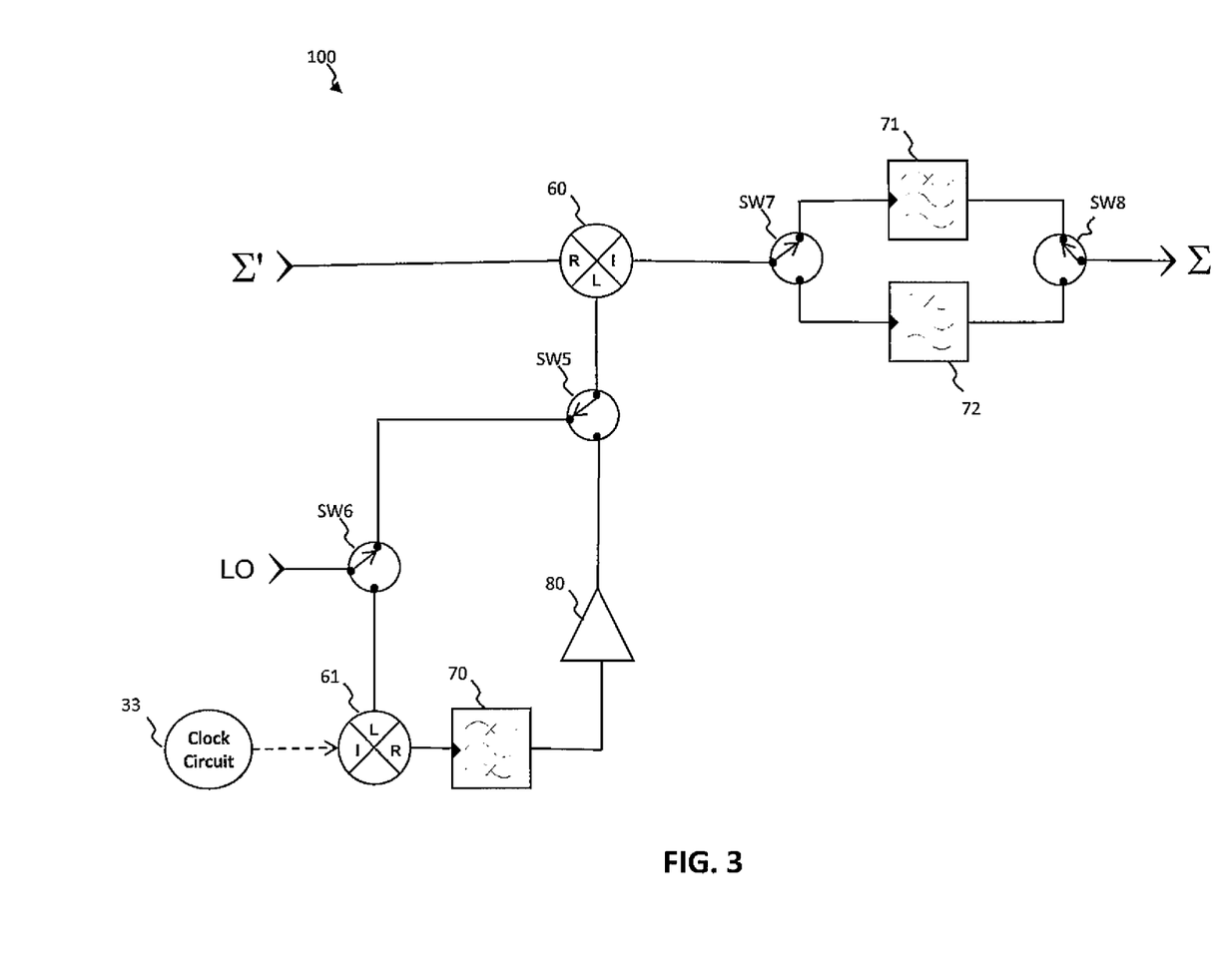
FIG. 3 is a schematic diagram of a signal conditioning circuit for the radar apparatus of FIG. 1.

Referring now to FIGS. 1 and 3. As described above, and as illustrated in FIG. 1, the receiver 4 may include a frequency converter 100. According to one embodiment, the frequency converter 100 conditions the signals received from the antenna prior to passing these signals to the ADC circuit 200. FIG. 3 is a schematic diagram of a frequency converter for a receiver according to an embodiment of the present invention.

According to one embodiment, the frequency converter 100 optimally centers a signal received from the antenna 2 to an efficient zone for ADC sampling. For example, the frequency converter 100 may center the sum signal $\Sigma$ to an optimal (or near optimal) point within a Nyquist zone, e.g., an optimal point for maximum bandwidth.

The frequency converter 100 of the present embodiment is configured to receive an unconditioned sum signal $\Sigma'$ from the antenna 2 and to mix the unconditioned sum signal $\Sigma'$ with a centering signal to optimally center the unconditioned sum signal $\Sigma'$ to generate the sum signal $\Sigma$, which is output to the ADC circuit 200. The frequency converter 100 may optionally include a filter stage.

According to one embodiment, the frequency converter 100 is electronically reconfigurable to optimize instantaneous bandwidth for the normal operation and time-interleaved operation of the ADC circuit 200.

The frequency converter 100 of the present embodiment includes a first mixer 60 that receives the unconditioned sum signal $\Sigma'$ and mixes the unconditioned sum signal $\Sigma'$ with a centering signal received from a fifth switch SW5 to output a centered sum signal. The centering signal is dynamically provided according to the mode of operation (i.e., it corresponds to one of the normal operation or time-interleaved operation) to optimally center the sum signal $\Sigma$.

Figure 4A:
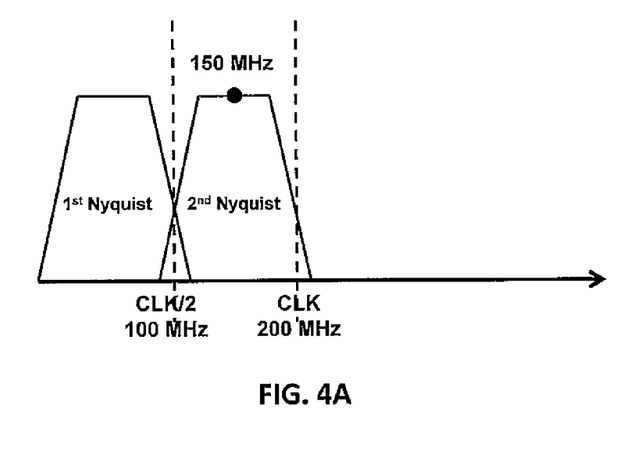
FIG. 4A illustrates an optimal centering point for a signal when in a radar apparatus is in normal operation according to an embodiment of the present invention.
Figure 4B:
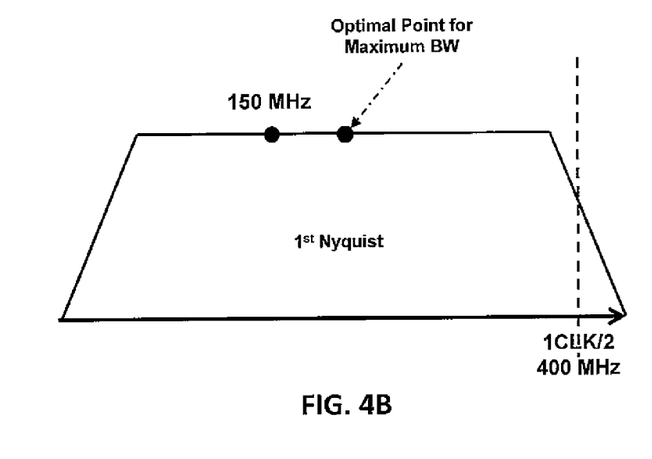
FIG. 4B illustrates an optimal centering point for a signal when a radar apparatus is in time-interleaved operation according to an embodiment of the present invention.

FIGS. 4A and 4B illustrate graphs showing optimal centering points for a signal according to an embodiment of the present invention. Specifically, FIG. 4A illustrates an optimal centering point for a signal when in normal operation, and FIG. 4B illustrates an optimal centering point for a signal when in time-interleaved operation.

In the example embodiment shown in FIG. 4A, the nominal ADC clock frequency is 200 MHz. The graph shows the first and second Nyquist zones for a 200 MHz sampling rate. Here, an optimal center point for the signal sampled at 200 MHz is shown to be in the center of the second Nyquist Zone, i.e., 150 MHz (or generally ¾f, where f is the sampling rate). A person of ordinary skill in the art would recognize that optimal center points are not limited to the above example, and may be variously set according to the application and operating parameters.

FIG. 4A corresponds to an example case where the ADC circuit 200 has a nominal sampling rate of 200 MHz in normal operation (e.g., multi-channel, narrow/medium-bandwidth). Here, in order to center a signal at 150 MHz (i.e., the optimal point for maximum bandwidth), the signal received from the antenna may be mixed with a suitable centering signal to produce an intermediate signal, which corresponds to the signal received from the antenna but centered at the optimal center point. The centering signal may be provided by a local oscillator LO that is set to a frequency suitable to center the signal received from the antenna during normal operation.

Referring back to FIG. 3, the present embodiment shows that a local oscillator signal LO is received at an input terminal of a sixth switch SW6, which has a first output terminal coupled to a first input terminal of the fifth switch SW5, and a second output terminal coupled to an input of a second mixer 61. In normal operation, the local oscillator signal LO is passed through the sixth switch SW6 and the fifth switch SW5 to the first mixer 60 to provide the centering signal suitable to center the unconditioned sum signal Σ' for the nominal sampling rate of its corresponding ADC.

If, however, the local oscillator signal LO is used as the centering signal during time-interleaved operation, the sum signal Σ will not be optimally centered because the effective sampling rate has increased. This phenomenon is illustrated in FIG. 4B.

In the example embodiment shown in FIG. 4B, the effective ADC clock frequency is 800 MHz (due to time interleaved operation of the ADCs). The graph shows the first Nyquist zone for an 800 MHz sampling rate. Here, an optimal center point for the signal sampled at 800 MHz is shown to be in the center of the first Nyquist Zone, i.e., 200 Mhz (or generally ¼f, where f is the sampling rate).

FIG. 4B corresponds to an example case where the ADC circuit 200 has an effective sampling rate of 800 MHz in time-interleaved (e.g., single-channel, wide-bandwidth). Here, in order to, center a signal at 200 MHz (i.e., an optimal point for maximum bandwidth), the signal received from the antenna may be mixed with a suitable centering signal to produce an intermediate signal, which corresponds to the signal received from the antenna but centered at the optimal center point.

Also shown on the graph is the center point corresponding to normal operation, i.e., 150 MHz in this example, which does not correspond to the optimal center point for time-interleaved operation. Accordingly, the local oscillator signal. LO used as the center signal in normal operation is not suitable for use as the center signal in time-interleaved operation.

Referring back to FIG. 3, the frequency converter 100 includes a circuit for providing a center signal suitable for time interleaved operation.

In the present embodiment, the fifth switch SW5 and the sixth switch SW6 may be placed in a second state that does not directly pass the local oscillator signal LO to the first mixer 60. Instead, the local oscillator signal LO may be mixed with another signal to adjust its frequency to a frequency suitable for the center signal in time-interleaved operation before being passed to the first mixer 60. According to one embodiment, the second mixer 61 mixes the local oscillator signal LO with a clock signal from the clock circuit 33 to generate the center signal with a suitable frequency for time-interleaved operation. According to one embodiment the clock signal corresponds to one quarter (¼) of the clock signal provided to one of the ADCs in the ADC circuit 200.

Accordingly, when the present embodiment is in time-interleaved operation, the local oscillator signal LO is passed through the sixth switch SW6 to the second mixer 61, which mixes the local oscillator signal LO with a clock signal from the clock circuit 33, to produce the centering signal suitable for the higher sampling rate of the effective wide-band ADC. The centering signal is provided from the second mixer 61 through the fifth switch SW5 to the first mixer 60 for mixing with the unconditioned sum signal Σ' to optimally, center the sum signal Σ.

In some embodiments, as shown in FIG. 3, the centering signal provided by the second mixer 61 may be filtered by a first filter 70 and may be amplified by a first amplifier 80 prior to being received by the first mixer 60.

The centered sum signal output from the first mixer 60 may pass through a filter stage before being output as the sum signal Σ to the ADC circuit 200. According to one embodiment, a different filter is applied to the centered sum signal depending on whether the ADC circuit 200 is in normal or time-interleaved operation. For example, when the ADC circuit 200 is in normal operation a filter may be applied to the centered sum signal that corresponds to the narrow/medium bandwidth, and when the ADC circuit 200 is in time-interleaved operation, a filter may be applied to the centered sum signal that corresponds to the wide bandwidth.

In the embodiment shown in FIG. 3, the centered sum signal is supplied to an input terminal of a seventh switch SW7. A first output terminal of the seventh switch SW7 is coupled to a second filter 71 (e.g., a narrow/medium bandwidth filter), which is coupled to a first input of an eighth switch SW8. A second output terminal of the seventh switch SW7 is coupled to a third filter 72 (e.g., a wide bandwidth filter), which is coupled to a second input terminal of an eighth switch SW8. The output of the eighth switch SW8 is coupled to the output of the frequency converter 100.

By selectively operating the seventh switch SW7 and eighth switch SW8, the centered sum signal may be selectively filtered by one of the second or third filters 71 or 72 before being output from the frequency converter 100 as the sum signal Σ. In the present embodiment, the centered sum signal is filtered by the second filter 71 during normal operation and is filtered by the third filter during time-interleaved operation.

The fifth through eighth switches SW5 through SW8 may be electronically controlled, for example, by switch control signals (not shown) received from the controller 300. Thus, the frequency converter 100 may be dynamically reconfigurable.

Accordingly, embodiments of the present invention may instantaneously optimize bandwidth for multi-channel, narrow/medium band operation and single-channel, wide-band operation. This may increase a theoretical maximum bandwidth by about 33% in certain embodiments.

Figure 5:
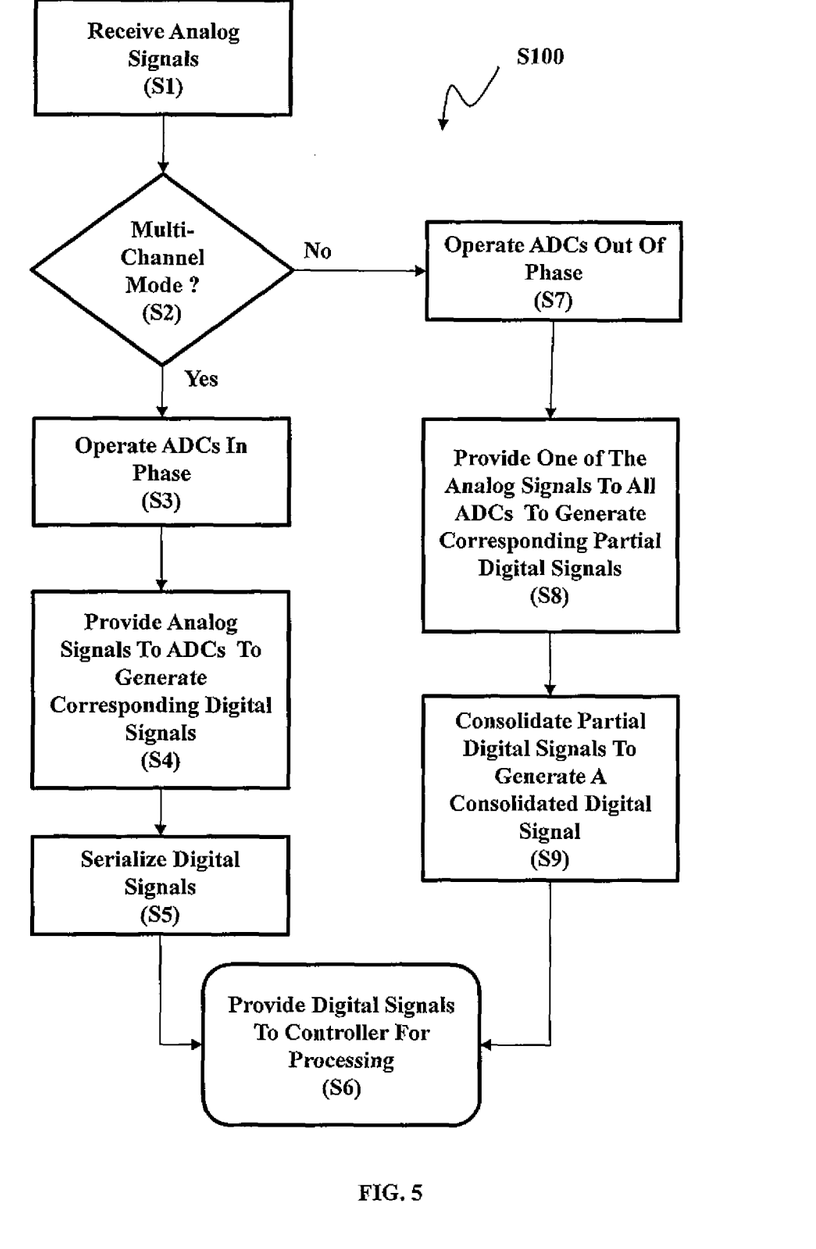
FIG. 5 is a flow diagram illustrating a method of operating an electronically reconfigurable multi-mode analog-to-digital converter circuit for a radar apparatus according to an embodiment of the present invention.

FIG. 5 is a flow diagram illustrating a method of operating an electronically reconfigurable multi-mode analog-to-digital converter circuit for a radar apparatus according to an embodiment of the present invention. According to one embodiment of the present invention, an electronically reconfigurable multi-mode analog-to-digital converter (ADC) circuit may have the following method of operation (S100).

The ADC circuit receives, analog signals (S1), and determines whether or not it is in a multi-channel mode or a single channel mode (S2).

If the ADC circuit is in multi-channel mode, the analog-to-digital converters (ADCs) included in the ADC circuit are operated in phase with one another (i.e., normal operation) (S3). Also, when in multi-channel mode, each of the ADCs receives a corresponding one of the analog signals to generate a corresponding one of the digital signals (S4). The digital signals are serialized (S5), and provided to the controller for processing (S6).

If, however, the ADC circuit is in single-channel mode, the ADCs included in the ADC circuit are operated out of phase with one another (i.e., time-interleaved operation) (S7). Also, when in single-channel mode, all of the ADCs receive a particular one of the analog signals to generate corresponding partial digital signals (S8). The partial digital signals are consolidated to generate a consolidated digital signal, which is the digital representation of the received one of the analog signals (S9). The consolidated digital signal is provided to the controller for processing (S6). In single-channel mode, the effective sampling rate of the ADCs operating in concert on one analog signal is higher than the nominal sampling rate of any one ADC.

Accordingly, by electronically reconfiguring an analog-to-digital converter circuit according to the above example method, a low cost dual mode (e.g., narrow/medium/wide-band resolution) analog-to-digital converter circuit is provided.

Figure 6:
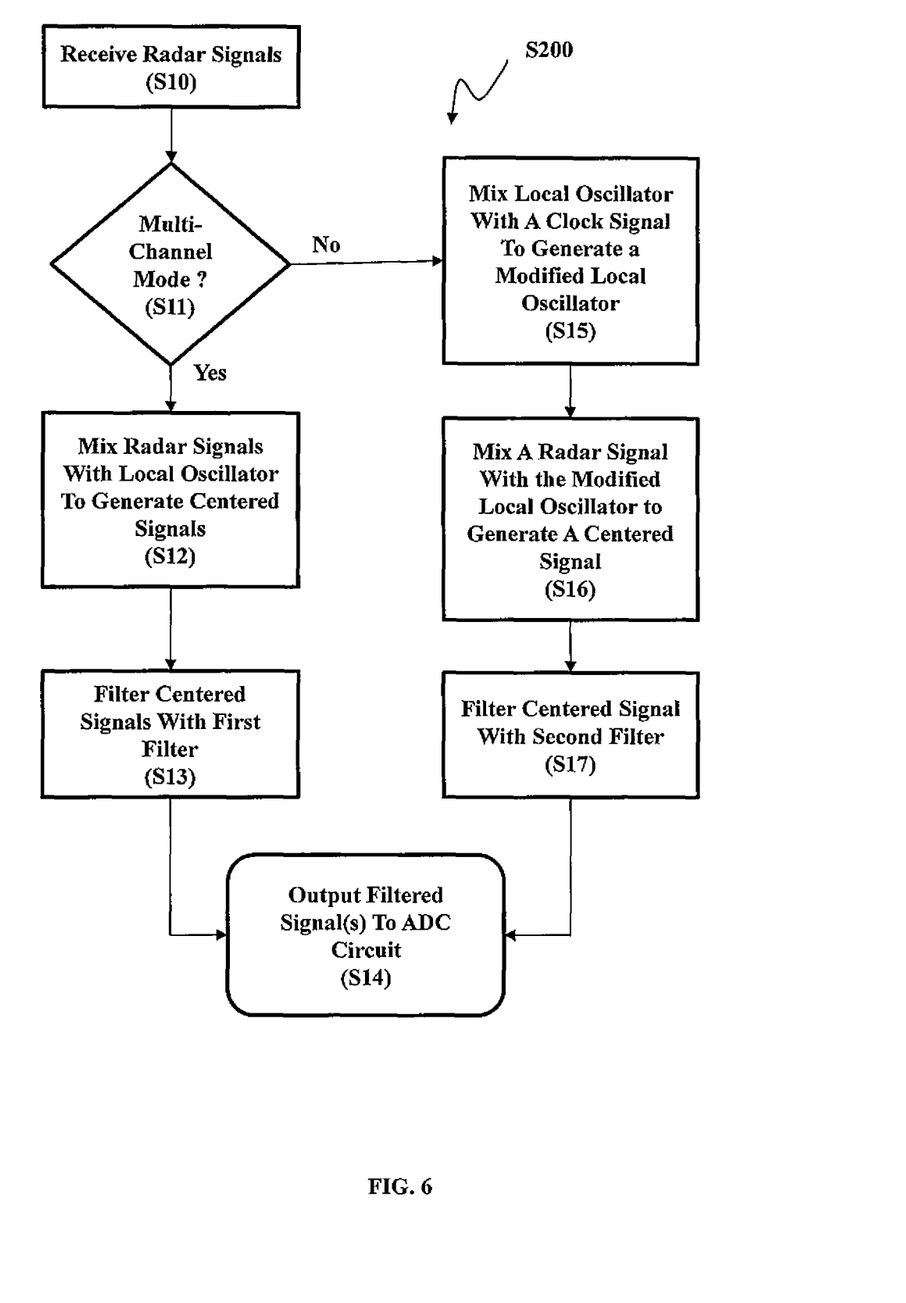
FIG. 6 is a flow diagram illustrating a method of optimally centering analog signals for use in a multi-mode analog-to-digital converter circuit for a radar apparatus according to an embodiment of the present invention.

FIG. 6 is a flow diagram illustrating a method of optimally centering analog signals for use in a multi-mode analog-to-digital converter circuit for a radar apparatus according to an embodiment of the present invention. According to one embodiment of the present invention, a frequency converter is operated according to the following method of operation (S200) to optimally center an analog signal for use in a multi-mode analog-to-digital converter circuit.

The signal condition receives radar signals from a radar antenna (S10), and determines whether or not a corresponding ADC circuit is operating in a multi-channel mode or single channel mode.

If in multi-channel mode, the frequency converter mixes the radar signals with a local oscillator to generate centered signals (S12). According to one embodiment, the radar signals are centered in a Nyquist zone (e.g., a second Nyquist zone). Here, the Nyquist zones may correspond to the sampling rate of the corresponding ADC circuit in multi-channel mode. Optionally, the centered signals may be filtered with a first filter corresponding to a first bandwidth resolution (S13). The signals are then output to the ADC circuit (S14).

If in single channel mode, the frequency converter mixes the local oscillator with a clock signal to generate a modified local oscillator (S15). Also, in the single channel mode, the frequency converter mixes the modified local oscillator with at least one of the radar signals to produce a centered radar signal (S16). According to one embodiment, the radar signal is centered in a Nyquist zone (e.g., a first Nyquist zone). Here, the Nyquist zones may correspond to the sampling rate of the corresponding ADC circuit in single-channel mode. Optionally, the centered signal may be filtered with a second filter corresponding to a second bandwidth resolution, wider than the first band width resolution (S17). The signal is then output to the ADC circuit (S14).

Accordingly, the frequency converter of the present embodiment optimizes instantaneous bandwidth for both modes of operation of a corresponding ADC circuit.

While aspects and features of reconfigurable multi-mode analog-to-digital converter circuits for radar devices according to the present invention have been illustrated and described in connection with certain example embodiments, it is to be understood that the invention is not limited to the described embodiments, but, on the contrary, is intended to cover various modifications and equivalent arrangements included within the spirit and scope of the appended claims. For example, while the example embodiments of the present invention have been described in connection with a four-channel device, embodiments of the present invention may have fewer or greater channels. Also, embodiments of the present invention may be combined with other methods of expanding bandwidth, for example, stretch processing or frequency jump bursting.

What is claimed is:

1. An analog-to-digital converter circuit for a radar apparatus, the analog-to-digital converter circuit comprising:
   a plurality of analog-to-digital converters,
   wherein the analog-to-digital converters are dynamically configurable to operate in a multi-channel mode with a first instantaneous bandwidth and a single-channel mode with a second instantaneous bandwidth higher than the first instantaneous bandwidth,
   wherein the analog-to-digital converters are configured to be operated in phase with one another when in the multi-channel mode, and
   wherein the analog-to-digital converters are configured to be operated out of phase with one another when in the single-channel mode.

2. The analog-to-digital converter circuit of claim 1,
   wherein, when in the multi-channel mode, each of the analog-to-digital converters is configured to receive a corresponding one of a plurality of analog input signals and is configured to sample the corresponding one of the analog input signals at a first sample rate to generate a corresponding one of a plurality of digital output signals,
   wherein, when in the single-channel mode, at least two of the analog-to-digital converters are configured to receive a same one of the analog input signals and are configured to collectively sample the same one of the analog input signals at a second sample rate to generate at least two of the digital output signals, the at least two of the digital output signals being configured to collectively digitally represent the same one of the analog input signals, and
   wherein the second sample rate is higher than the first sample rate.

3. The analog-to-digital converter circuit of claim 1,
   wherein each of the analog-to-digital converters is configured to receive a corresponding one of a plurality of clock signals,
   wherein each of the analog-to-digital converters is configured to take samples corresponding to its respective clock signal,
   wherein, when in the multi-channel mode, the clock signals are in phase with one another, and
   wherein, when in the single-channel mode, the clock signals are out of phase with one another.

4. The analog-to-digital converter circuit of claim 3,
   wherein, when in the single-channel mode, a phase spacing of the clock signals is set according to 360°/N, N being a number of analog-to-digital converters, and
   wherein, when in the single-channel mode, a collective sampling rate of the analog-to-digital converters corresponds to N×F, F being a nominal sampling rate of one of the analog-to-digital converters.

5. The analog-to-digital converter circuit of claim 1, further comprising:
   a plurality of input switches, each of the input switches having an input terminal, a first output terminal, and a second output terminal, each of the input switches being dynamically configurable to be in a first state where the input terminal is coupled to the first output terminal or a second state where the input terminal is coupled to the second output terminal, and each of the input switches configured to receive one of a plurality of analog input signals at its input terminal; and
   a splitter coupled to the second output terminal of a first input switch of the input switches and coupled to an input of each of the analog-to-digital converters, the splitter being configured to provide a first analog input signal of the analog input signals received by the first switch to the input of each of the analog-to-digital converters when the switches are in the second state,
   wherein the first output terminal of each of the switches is coupled to the input of a corresponding one of the analog-to-digital converters,
   wherein the second output terminal of each of the switches other than the first switch is not coupled to any of the analog-to-digital converters,
   wherein the switches are in the first state when in the multi-channel mode, and
   wherein the switches are in the second state when in the single channel mode.

6. The analog-to-digital converter circuit of claim 5, further comprising a multiplexer having a plurality of input terminals and an output terminal,
wherein each of the input terminals of the multiplexer is coupled to an output terminal of a corresponding one of the analog-to-digital converters.

7. A receiver for a radar apparatus, the receiver comprising:
a controller; and
an analog-to-digital converter circuit coupled to the controller, the analog-to-digital converter circuit comprising plurality of analog-to-digital converters,
wherein the receiver is configured to receive a plurality of radar signals from a radar antenna, and is to operate in one of a multi-channel mode with a first instantaneous bandwidth and a single-channel mode with a second instantaneous bandwidth higher than the first instantaneous bandwidth,
wherein the analog-to-digital converters are configured to be operated in phase with one another when in the multi-channel mode, and
wherein the analog-to-digital converters are configured to be operated out of phase with one another when in the single-channel mode.

8. The receiver of claim 7,
wherein the controller comprises a clock circuit configured to provide a plurality of clock signals,
wherein each of the analog-to-digital converters is configured to receive a corresponding one of the plurality of clock signals,
wherein each of the analog-to-digital converters is configured to take samples according to the corresponding one of the clock signals,
wherein, when in the multi-channel mode, the clock signals are in phase with one another, and
wherein, when in the single-channel mode, the clock signals are out of phase with one another.

9. The receiver of claim 8,
wherein, when in the single-channel mode, a phase spacing of the clock signals is set according to 360°/N, N being a number of analog-to-digital converters, and
Wherein, when in the single-channel mode, a collective sampling rate of the analog-to-digital converters corresponds to N×F, F being a nominal sampling rate of one of the analog-to-digital converters.

10. The receiver of claim 7,
wherein the analog-to-digital converter circuit further comprises:
a plurality of input switches, each of the input switches having an input terminal, a first output terminal, and a second output terminal, each of the input switches being dynamically configurable to be in a first state where the input terminal is coupled to the first output terminal or a second state where the input terminal is coupled to the second output terminal, and each of the input switches configured to receive one of a plurality of analog input signals at its input terminal, the analog input signals corresponding to the radar signals; and
a splitter coupled to the second output terminal of a first input switch of the input switches and coupled to an input of each of the analog-to-digital converters, the splitter being configured to provide a first analog input signal of the analog input signals received by the first switch to the input of each of the analog-to-digital converters when the switches are in the second state,
wherein the first output terminal of each of the switches is coupled to the input of a corresponding one of the analog-to-digital converters,
wherein the second output terminal of each of the switches other than the first switch is not coupled to any of the analog-to-digital converters,
wherein the switches are in the first state when in the multi-channel mode, and
wherein the switches are in the second state when in the single channel mode.

11. The receiver of claim 10,
wherein the analog-to-digital converter circuit further comprises a multiplexer having a plurality of input terminals and an output terminal,
wherein each of the input terminals of the multiplexer is coupled to an output terminal of a corresponding one of the analog-to-digital converters, and
wherein the output of the multiplexer is coupled to the controller.

12. The receiver of claim 7,
further comprising a frequency converter configured to receive the radar signals from the radar antenna and electronically reconfigurable to dynamically center at least one of the radar signals according to whether the receiver is in the multi-channel mode or the single channel mode to generate at least one analog input signal provided to the analog-to-digital converter circuit.

13. The receiver of claim 12,
wherein the frequency converter comprises a first mixer configured to receive a first radar signal of the radar signals, to receive a center signal, and to mix the first radar signal with the center signal to generate a centered first radar signal,
wherein the center signal is dynamically adjustable according to whether the receiver is in the multi-channel mode or the single channel mode, and
wherein the at least one analog input signal provided to the analog to digital converter circuit corresponds to the centered first radar signal.

14. The receiver of claim 13, wherein the frequency converter further comprises:
a first switch having an output terminal coupled to the first mixer to provide the center signal, a first input terminal, and a second input terminal;
a local oscillator configured to provide a local oscillator signal corresponding to a signal capable of centering the first radar signal in a first bandwidth Nyquist zone, which corresponds to the first bandwidth resolution, when mixed with the first radar signal, the local oscillator signal being provided to the first input terminal of the first switch; and
a second mixer configured to receive a clock signal and the local oscillator signal, to mix the clock signal and the local oscillator signal to provide a modified local oscillator signal corresponding to a signal capable of centering the first radar signal in a second bandwidth Nyquist zone, which corresponds to the second bandwidth resolution, when mixed with the first radar signal, the modified local oscillator signal being provided to the second input terminal of the first switch.

15. The receiver of claim 14, wherein the frequency converter further comprises a first filter and a second filter,
wherein the first filter is configured to filter the centered first radar signal when in multi-channel mode, and
wherein the second filter is configured to filter the centered first radar signal when in single-channel mode.

16. A method of operating a multi-mode analog-to-digital converter circuit comprising a plurality of digital to analog converters, the method comprising receiving a plurality of analog signals;
determining whether the multi-mode analog-to-digital converter circuit is in a single channel mode or a multi-channel mode;
when the multi-mode analog-to-digital converter circuit is in the multi-channel mode:
provide the analog signals to the analog-to-digital circuits to generate a plurality of digital signals corresponding to the analog signals, the digital signals having been sampled at a first sampling rate; and
drive the analog-to-digital converters in phase with one another; and
when the multi-mode analog-to-digital converter circuit is in the single channel mode:
provide a same one of the analog signals to the analog-to-digital converters to generate the digital signals corresponding to the same one of the analog signals;
consolidate the digital signals to generate a consolidated digital signal corresponding to the same one of the analog signals, the consolidated digital signal having an effective sampling rate that is higher than the first sampling rate; and
driving the analog-to-digital converters out of phase with one another.

17. The method of claim 16,
wherein, when in single channel mode, a phase spacing for driving the analog-to-digital converters is set according to 360°/N, N being a number of the analog-to-digital converters, and
wherein, when in the single channel mode, the effective sampling rate of the analog-to-digital converters corresponds to N×F, F being a nominal sampling rate of one of the analog-to-digital converters.

18. The method of claim 16, further comprising centering at least one of the analog signals in a Nyquist zone before providing the at least one of the analog signals to the analog-to-digital converters, the centering being performed according to whether the multi-mode analog-to-digital converter circuit is in the multi-channel mode or the single channel mode.

19. The method of claim 18, further comprising filtering the at least one of the analog signals before providing the at least one of the analog signals to the analog-to-digital converters, the filtering being performed according to whether the multi-mode analog-to-digital converter circuit is in the multi-channel mode or the single channel mode.

* * * * *